United States Patent
Nakao

(10) Patent No.: US 7,115,424 B2
(45) Date of Patent: Oct. 3, 2006

(54) METHOD FOR MANUFACTURING SEMICONDUCTOR DEVICE

(75) Inventor: Takashi Nakao, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 10/231,246

(22) Filed: Aug. 30, 2002

(65) Prior Publication Data

US 2003/0045961 A1  Mar. 6, 2003

(30) Foreign Application Priority Data

Aug. 31, 2001 (JP) ............................. 2001-264868

(51) Int. Cl.
    *H01L 21/00* (2006.01)
(52) U.S. Cl. ...................................... 438/5
(58) Field of Classification Search ................ 438/16,
    438/115, 663, 680, 723, 716, 770, 773, 778,
    438/787, 795, 5–15, 25, 26, 55, 64, 106,
    438/107, 109, 110, 128, 450; 700/121, 109;
    702/85–95, 102–104, 130, 30, 182; 156/345;
    361/736, 790, 749, 767; 257/686, 737, 738,
    257/778
    See application file for complete search history.

(56) References Cited

U.S. PATENT DOCUMENTS 6,408,220 B1 * 6/2002 Nulman ...................... 700/121
6,603,538 B1 * 8/2003 Oluseyi et al. ................ 356/72
6,633,391 B1 * 10/2003 Oluseyi et al. ............. 356/630
6,738,722 B1 * 5/2004 Polla et al. .................. 702/104

FOREIGN PATENT DOCUMENTS

| JP | 5-21382 | 1/1993 |
|----|---------|--------|
| JP | 11-330185 | 11/1999 |
| JP | 2000-252179 | 9/2000 |
| JP | 2002-518823 | 6/2002 |
| KR | 2001-52752 | 6/2001 |

* cited by examiner

*Primary Examiner*—Michael Lebentritt
*Assistant Examiner*—Andre' Stevenson
(74) *Attorney, Agent, or Firm*—Finnegan, Henderson, Farabow, Garrett & Dunner, L.L.P.

(57) ABSTRACT

A method for manufacturing a semiconductor device, comprising determining a first processing condition to apply a predetermined processing to a base body in a reaction chamber of a semiconductor device manufacturing apparatus, processing the base body based on the determined first processing condition, measuring one or more process parameters which vary the processing capability of the process on the base body during the processing, determining a second processing condition during the processing so that the processing amount is a set value, from a reference state representing the relation between the processing capability and the process parameter, and the measured value of the process parameter measured during processing, and changing the processing condition from the first processing condition to the second processing condition during the processing, and performing the processing based on the second processing condition.

12 Claims, 5 Drawing Sheets

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2001-264868, filed Aug. 31, 2001, the entire contents of which are incorporated herein by reference.

BACKGROUND OF THE INVENTION

1. Field of the Invention

The present invention relates to a semiconductor device manufacturing method for forming semiconductor devices at excellent repeatability.

2. Description of the Related Art

In the conventional process of manufacturing a semiconductor device, the repeatability of the process of manufacturing a semiconductor device is not always stable. Causes are attributable to stability of the semiconductor manufacturing apparatus, such as instability or deterioration of a heating device or plasma generating device of the semiconductor manufacturing apparatus itself and aging effects due to deposits accumulated in the reaction chamber or the like, and are sometimes also attributable to semiconductor wafers.

Since the repeatability of the process of manufacturing a semiconductor device is not stable, the processing amount such as film forming amount or etching amount may fluctuate from the set values, and the manufactured semiconductor device may fail to exhibit the designed performance.

BRIEF SUMMARY OF THE INVENTION

According to one aspect of the present invention, there is provided a method for manufacturing a semiconductor device, comprising:

determining a first processing condition to apply a predetermined processing to a base body in a reaction chamber of a semiconductor device manufacturing apparatus;

processing the base body according to the determined first processing condition;

measuring one or more process parameters which vary the processing capability of the process on the base body during the processing;

determining a second processing condition during the processing so that the processing amount may be a set value, from a reference state representing the relation between the processing capability and the process parameter, and the measured value of the process parameter measured during processing; and changing the processing condition from the first processing condition to the second processing condition during the processing, and performing the processing based on the second processing condition.

DETAILED DESCRIPTION OF THE INVENTION

Figure 1:
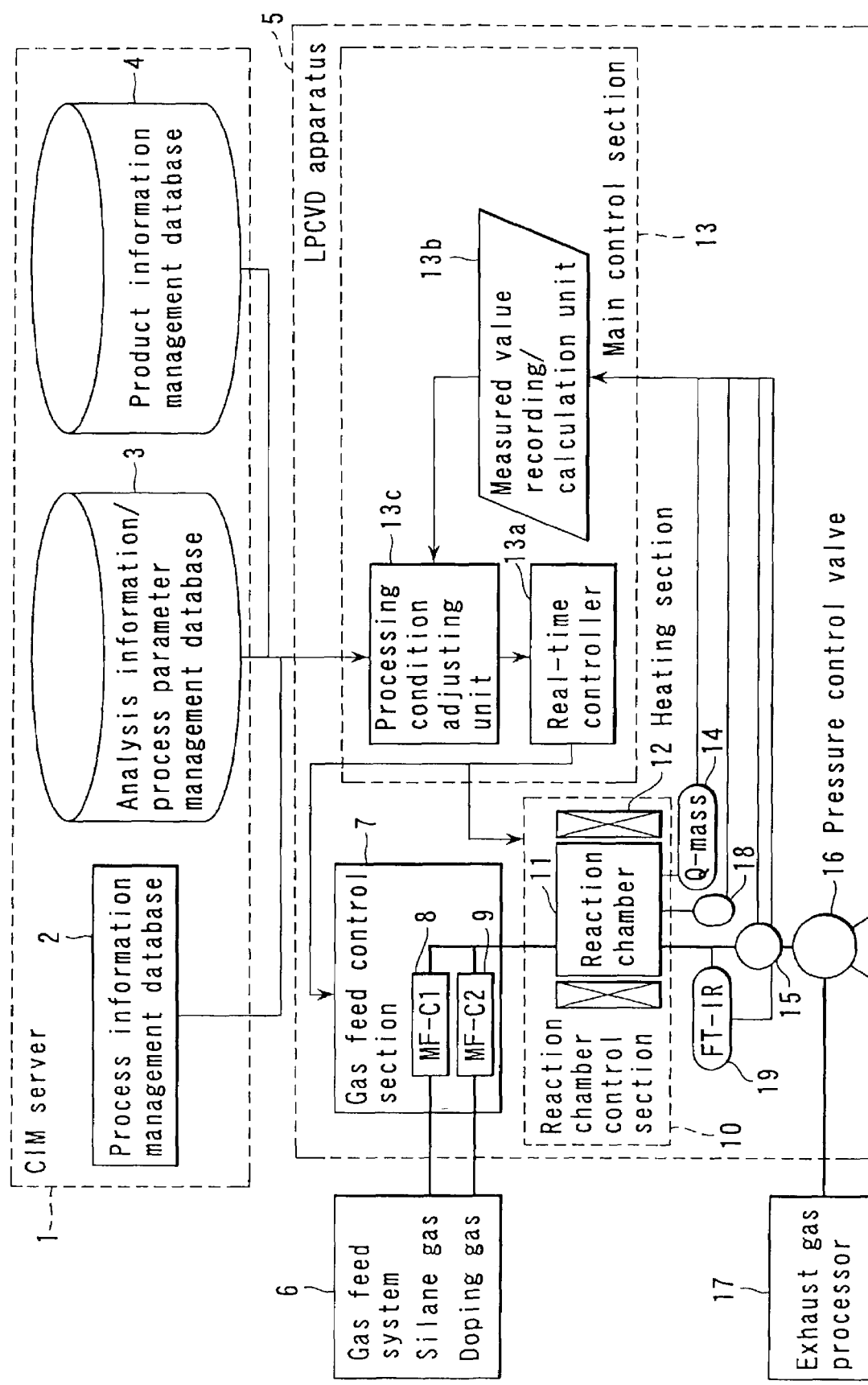
FIG. 1 is a block diagram schematically showing a configuration of a semiconductor device manufacturing system according to a first embodiment.

Referring now to the drawings, embodiments of the invention are explained below.

FIRST EMBODIMENT

A first embodiment is a semiconductor device manufacturing system comprising a low pressure chemical vapor deposition (LPCVD) apparatus and a computer integrated manufacturing (CIM) apparatus for controlling and managing the LPCVD apparatus in a semiconductor manufacturing plant as shown in FIG. 1.

In the semiconductor manufacturing apparatus, that is, the LPCVD apparatus 5, monosilane gas and phosphine as doping material gas are supplied from a gas feeding system 6 at the plant side. The supply flow rate of monosilane gas is controlled by a first mass flow controller (MFC1) 8. The supply flow rate of phosphine gas is controlled by a second mass flow controller (MFC2) 9. The first and second mass flow controllers 8, 9 are controlled by a gas feed control section 7 which is a constituent element of the LPCVD apparatus 5.

The internal temperature of a reaction chamber 11 is controlled by a heating section 12 comprising a heating body and a temperature measuring device. The heating section 12 is controlled by a reaction chamber control section 10 which is a constituent element of the LPCVD apparatus 5.

A vacuum exhaust device 16 is connected to the reaction chamber 11. In the midst of a pipe connecting between the reaction chamber 11 and the vacuum exhaust device 16, a pressure control valve 15 for regulating the exhaust speed is installed. The pressure control valve 15 regulates the exhaust speed by adjusting the fluid conductance of the gas. Material gases such as monosilane and phosphine exhausted from the vacuum exhaust device 16, and product gases produced from them are treated in an exhaust gas processor 17, and harmful substances are removed.

The pressure control valve 15 has a function of attaining and maintaining the set pressure by adjusting the conductance from the difference between the pressure value measured by a pressure gauge 18 linked to the reaction chamber 11 and the set pressure value commanded from the reaction chamber control section 10. It also has a function of sending the opening degree representing the state of adjustment in real time to a main control section 13 of the semiconductor device manufacturing apparatus.

The reaction chamber 11 incorporates a gas mass analyzer (Q-mass) 14 and an infrared absorption analyzer (Fourier transform infrared spectrometer FT-IR) 19. The gas mass analyzer 14 and infrared absorption analyzer 19 have functions of measuring the gas components and gas concentration in the atmosphere of the reaction chamber 11 in an arbitrary time including the film forming process. The infrared absorption analyzer 19 and gas mass analyzer 14 also have functions of sending the measured results to the main control section 13 in real time.

The LPCVD device 5 is controlled by the CIM server 1 which controls the manufacturing process. The CIM server 1 comprises a process information management database 2, an analysis information/process parameter management database 3, and a product information management database 4.

The process information management database 2 manages the process information such as process condition for processing the semiconductor substrate (base body) and film forming recipe (processing condition). The analysis information/process parameter management database 3 manages process parameters having effects on the film thickness or uniformity such as partial pressure of material gas, that is, monosilane gas in the reaction chamber of the LPCVD device 5 and its decomposition product, that is, silirene gas in the reaction chamber, temperature inside the reaction chamber 11, pressure in the reaction chamber 11, and opening degree of the pressure control valve 15. The analysis information/process parameter management database 3 also manages the film forming capability (processing capability) information such as film thickness or uniformity measured in the inspection process after film forming process. The product information management database 4 manages the product information recording the design surface area of product, surface composition, and the actual process history of the semiconductor substrate, and the values measured in the inspection process.

The product information management database 4 also incorporates a program for calculating the surface area including the processing shape of the actual semiconductor substrate from the measured value (processing amount) in dimension measurement in the lithography process, RIE process and other process, or correcting the design surface area. Dimensions are measured by a dimension measuring instrument, and each measured value is recorded in the product information management database 4 composing the CIM server 1. By comparing the design dimensions recorded in the product information management database 4 and the actual dimensions, the bias in lithography or RIE process is calculated. In many regions which are not actually measured, the surface area can be estimated from the calculated bias values. Similarly, from the data recorded in the product information management database 4, such as the film thickness of the semiconductor substrate processed herein or before RIE process on the semiconductor substrate processed at the same time, or measurement of step difference of the semiconductor substrate after RIE process, the surface area can be calculated by obtaining not only the plane dimensions but also the dimension in the depth direction.

The database also incorporates a program for correcting the surface area on the semiconductor substrate from the results of measuring film thickness in the film forming process such as LPCVD process of PECVD process, or measured values of remaining film thickness after CMP or RIE process.

The film thickness and residual film data recorded in the product information management database 4 are classified by apparatus and processing condition in relation to the process information of film forming or etching of the product recorded in the process information management database 2.

The analysis information/process parameter management database 3 records data such as the film thickness uniformity after processing such as film forming or etching, film forming speed, etching speed, and the like, as the processing capability information of the film forming apparatus or etching apparatus connected in the network inside and outside the plant including the LPCVD apparatus 5. Further, in each arbitrary data group such as apparatus or condition, it records the feature quantities obtained by statistic processing such as average, standard deviation, Cp value, Cpk value, and CL (control limit).

In the LPCVD apparatus 5 and CIM server 1 explained herein, the process of forming an LPCVD film of amorphous silicon film containing phosphorus is explained below according to the manufacturing procedure.

First, from the process information recorded in the process information management database 2 such as process condition and film forming recipe (processing condition), the film forming recipe is determined depending on the film type and film thickness of the products processed in the film forming process by the LPCVD apparatus 5. The film forming recipe information including the temperature, pressure, and material gas flow rate specified in the determined film forming condition is automatically transmitted to the main control section 13 in the LPCVD apparatus 5 through the network. Semiconductor substrates are supplied into the reaction chamber 11 by an automatic mobile carrying machine, and a real-time controller 13a commands the gas flow rate, increase or decrease speed of gas flow rate, and opening or closing of the feed valve to the gas feed control section 7 so as to be adjusted to the set value in each stage of the film forming recipe information, and commands the setting of temperature and setting of pressure sequentially to the reaction chamber control section 10. The reaction chamber control section 10 controls the internal temperature of the reaction chamber 11 by the heating section 12, and the pressure in the reaction chamber 11 is controlled by the pressure gauge 18 and pressure control valve 15.

Figure 2A:
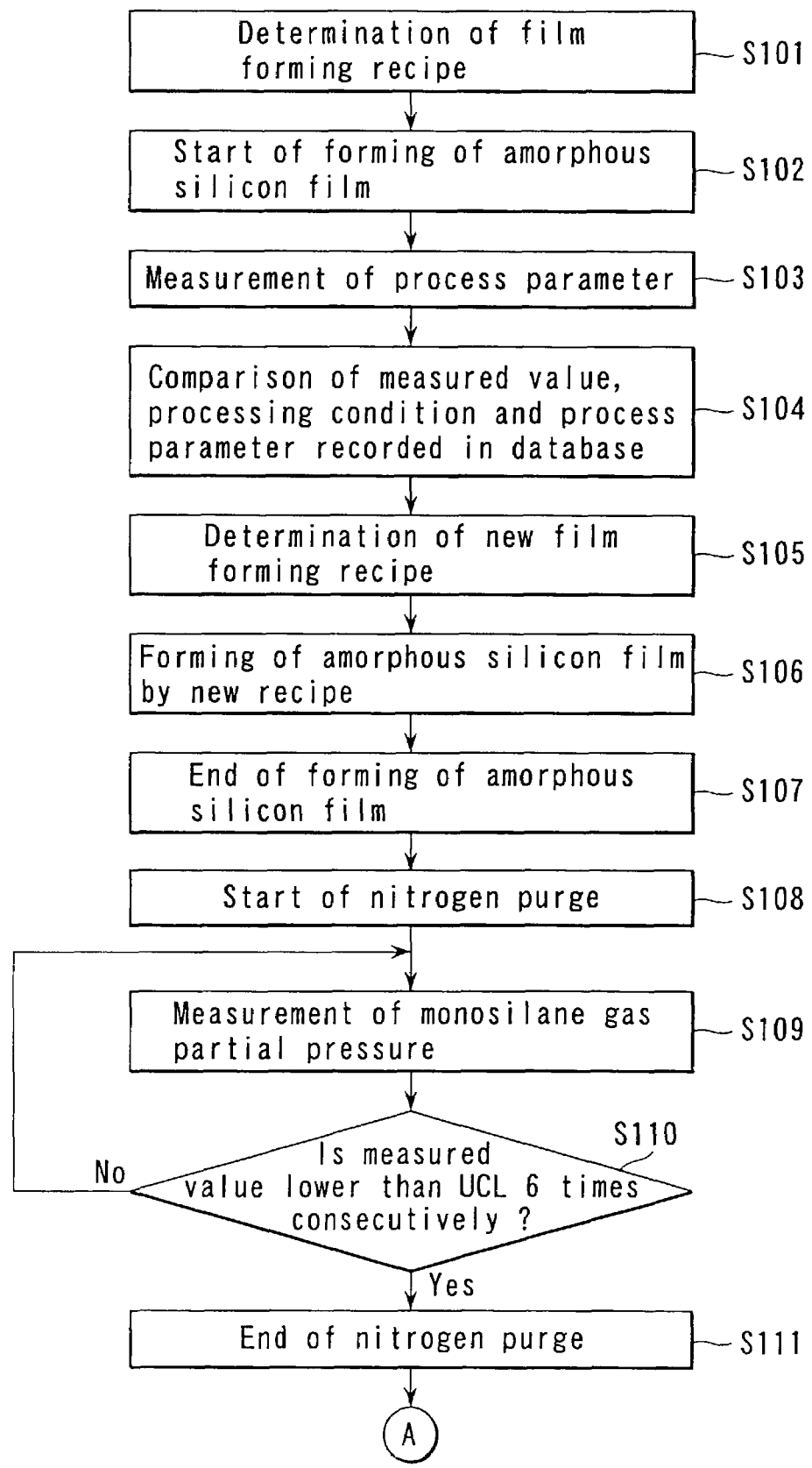
FIGS. 2A and 2B are flowcharts explaining a method of controlling the semiconductor device manufacturing system according to the first embodiment.
Figure 2B:
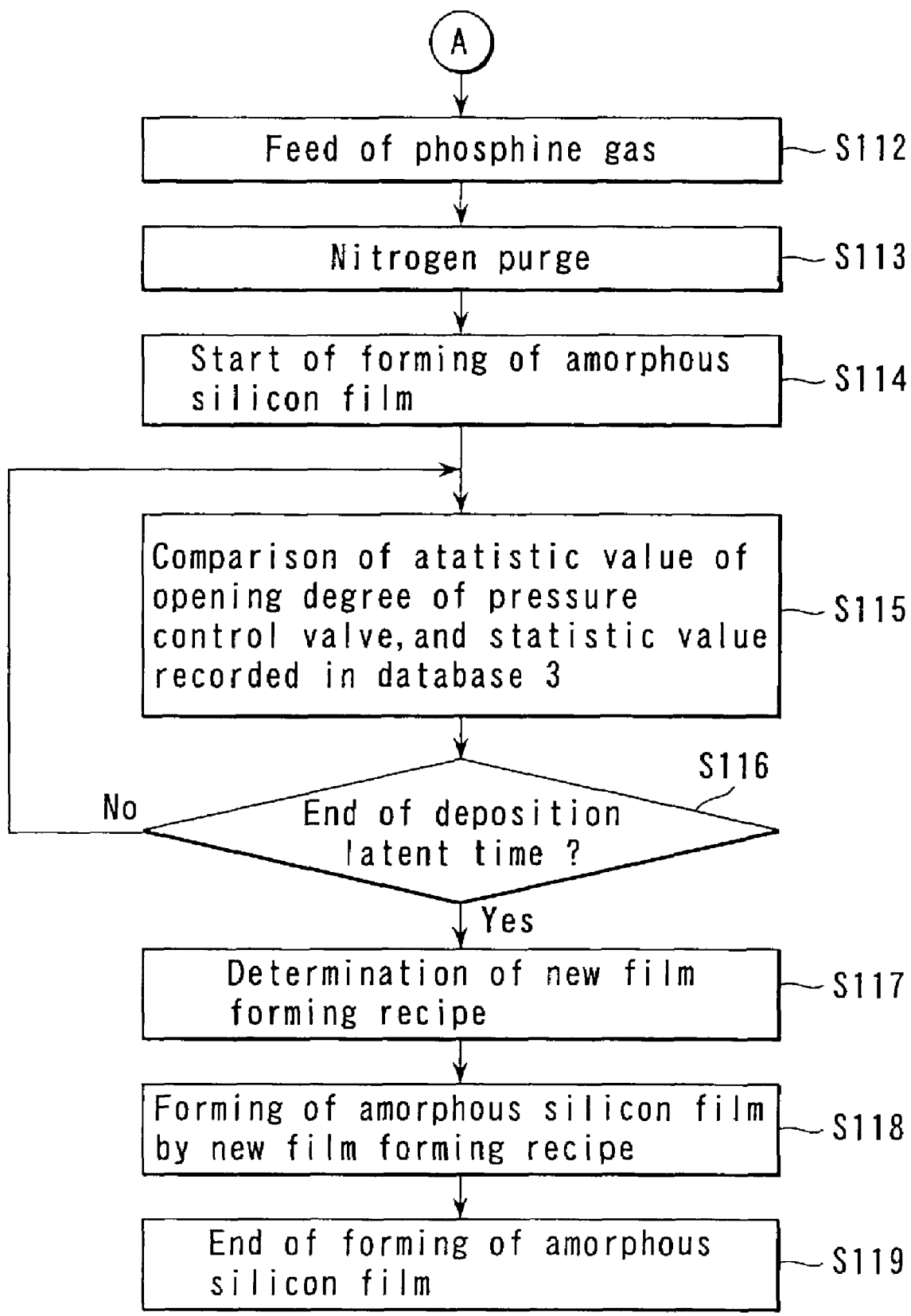

By LPCVD by pyrolysis of silane gas, an amorphous silicon film is formed as a first layer in a thickness of 20 nm, a phosphorus adsorption layer is formed on the amorphous silicon film, and further an amorphous silicon film is formed in a thickness of 20 nm, and finally an amorphous silicon film containing phosphorus is formed in a thickness of 40 nm, and an example of executing this recipe is explained in detail below. FIGS. 2A and 2B are flowcharts explaining a method of control the semiconductor device manufacturing system according to the first embodiment of the invention.

(Step S101)

Referring first to the process information management database 2, the film forming recipe (first processing condition) is made. The determined film forming recipe is as followed. Under the condition of reaction chamber temperature of 550° C. and reaction chamber pressure of 133 Pa, an amorphous silicon film is formed as a first layer by LPCVD by silane gas pyrolysis for 11 minutes, a phosphorus adsorption layer is formed on the amorphous silicon film at pressure of 266 Pa, and then an amorphous silicon film is formed for 11 minutes.

Figure 3:
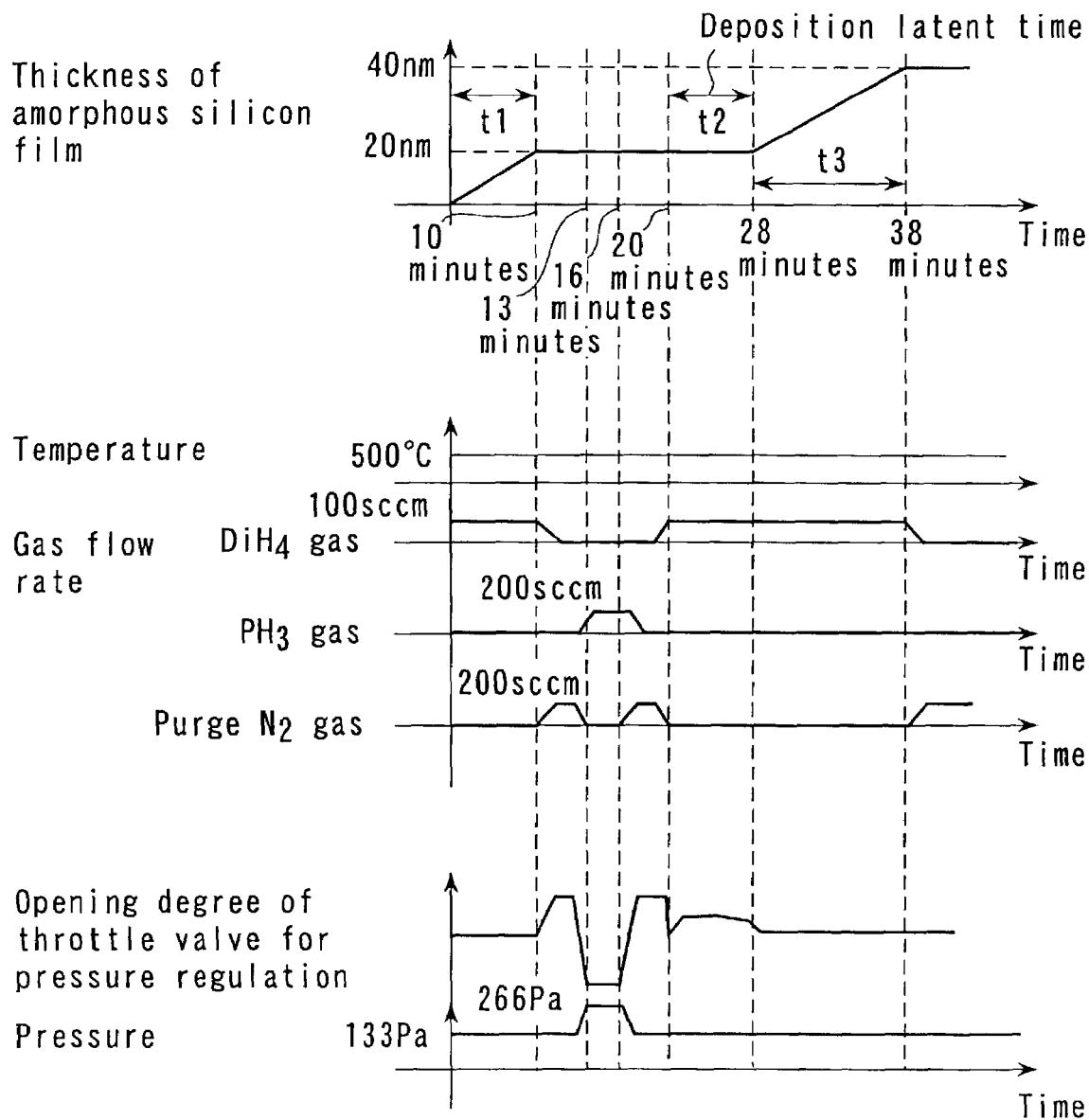
FIG. 3 is a characteristic diagram showing changes of process parameters in relation to the lapse of time.
Figure 4:
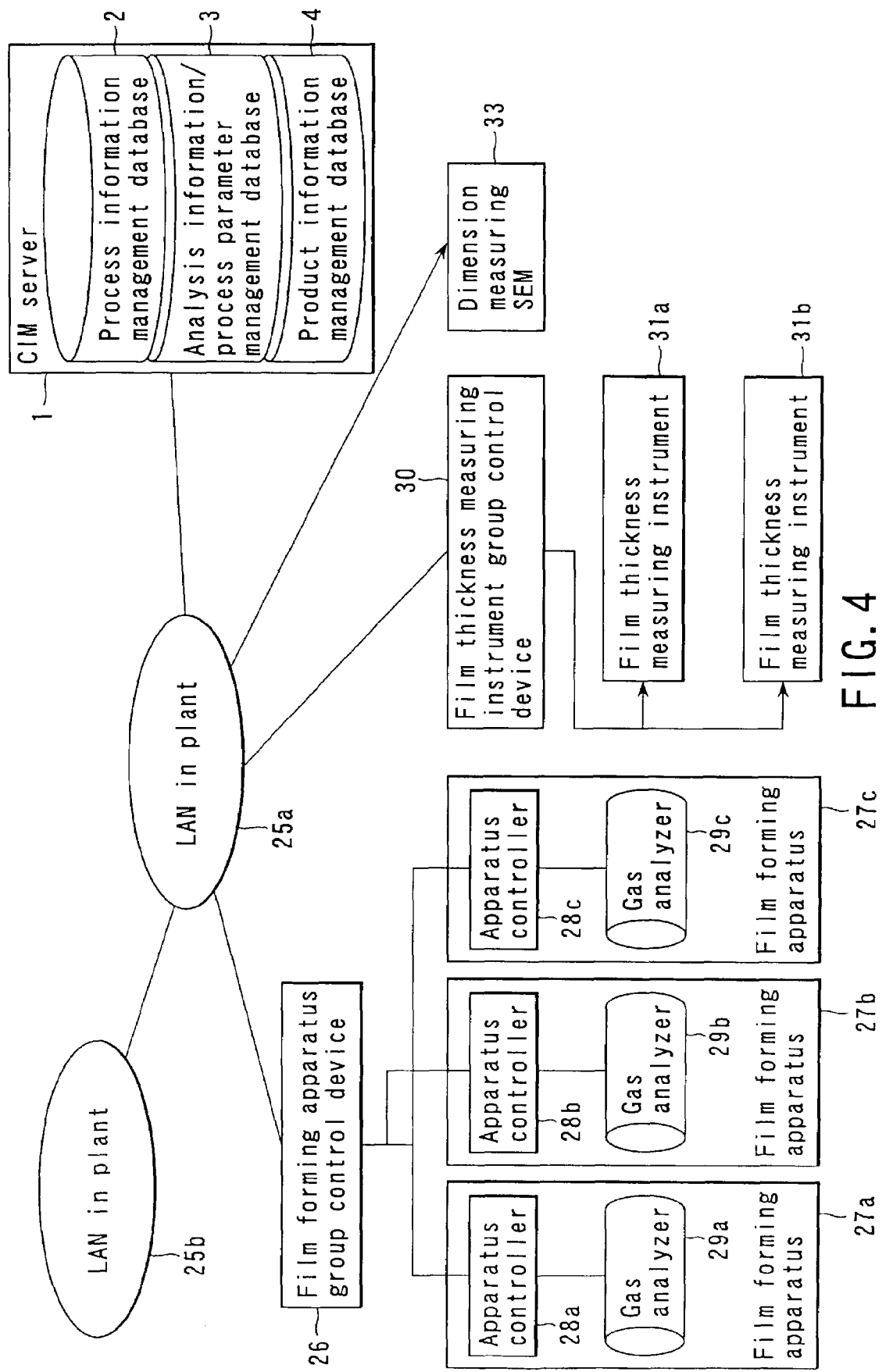
FIG. 4 is a block diagram showing a modified example of the semiconductor device manufacturing system.

FIG. 3 explains the sequence of the LPCVD film forming process of the amorphous silicon film including a phosphorus doping process, showing the time-course changes of, sequentially from the top, the thickness of the formed amorphous silicon film, the temperature estimated from the output value of the heating unit 12, the flow rate of monosilane gas, phosphine gas, and nitrogen gas for purging estimated from the output value of the gas feed control unit 7, and the output value of the pressure gauge 18, and opening degree of the pressure control valve estimated from the output value of the pressure control valve 15.

(Steps S102, S103)

The reaction chamber temperature is adjusted to 550° C. according to the recipe, and the pressure in the reaction chamber is stable at 133 Pa. By feeding monosilane gas at a flow rate of 100 sccm, film forming of amorphous silicon is started. At this step, the reaction chamber temperature and the required power consumption of the heating section 12 are measured by the heating section 12, and the reaction chamber pressure is measured by the pressure gauge 18, at a frequency of, for example, once in every 1 msec. Each measured value is outputted to the main control section 13. A measured value recording/calculation unit 13b in the main control section 13, for recording the measured values, records these measured values, and at the same time calculates the temperature, the power consumption, the pressure, each time average and standard deviation in real time.

As shown in FIG. 3, the average value of the actual temperature in the reaction chamber is 550° C., and the average value of the actual pressure in the reaction chamber is 133 Pa. The real-time output data and statistic values such as average values are outputted from the main control section 13 to the analysis information/process parameter management database 3 composing the CIM server 1.

The film forming speed of film forming in the past of the amorphous silicon by monosilane gas in the LPCVD apparatus 5 is recorded in the analysis information/process parameter management database 3 in which the processing capability and analysis measured values are recorded, and the condition at each time is inputted in the process information management database 2, and the film forming speed in each different condition is classified by condition and recorded.

(Step S104)

Suppose the reaction chamber temperature is 550° C. and the pressure is 133 Pa in the LPCVD apparatus 5, the latest film forming speed recorded in the database 3 is read out. At this time, suppose the film forming speed is 2 nm every minute.

(Step S105).

From the film forming speed recorded in the database 3 as compared with the process parameter, the film forming time (second processing condition) is calculated to be 10 minutes if a film thickness of 20 nm is needed as the first layer.

(Step 106)

This newly calculated film forming time is sent back to the main control section 13 of the LPCVD apparatus 5. The difference from the film forming time of 11 minutes specified as the film forming recipe from the process information management database 2 is calculated before start of film forming by a processing condition adjusting unit 13c which compares with the process parameter, and a command is issued to the gas feed control section 7 as feed-forward control to stop supply of monosilane gas one minute earlier, in 10 minutes.

(Step S107)

By this feed-forward control, considering fluctuations of film forming speed of the LPCVD apparatus 5, a desired film thickness of 20 nm can be obtained.

(Step S108)

After feeding monosilane gas for time $t_1$=10 minutes, feed of monosilane gas is stopped, and the inside of the reaction chamber 11 is sufficiently purged with nitrogen gas. After the reaction chamber 11 is purged with nitrogen gas, phosphine gas is supplied as doping gas.

Herein, purge of monosilane gas from the reaction chamber 11 is necessary for suppressing chemical reaction by interaction of phosphine gas and monosilane gas by avoiding mixing of phosphine gas and monosilane gas. Forming of the amorphous silicon film by chemical reaction of phosphine and monosilane gas is higher in reaction rate than in the case of monosilane gas alone, and the film forming reaction is supply rate-determining, and hence uniformity of film forming thickness or phosphorus concentration tends to deteriorate.

(Step S109)

Right after start of purge with nitrogen, measurement of partial pressure of monosilane gas in the gas in the reaction chamber 11 starts, for example, at a rate of once in every 10 seconds by infrared absorption spectroscopy by the gas mass analyzer 14 or infrared absorption analyzer 19, and results are outputted to the main control section 13.

(Step S110)

The measured value recording/calculation unit 13b calculates the average and standard deviation of detection intensity of mass number derived from monosilane gas and absorption spectrum intensity of infrared absorption. In the analysis information/process parameter management database 3 having the processing capability and analyzed values recorded therein, the concentration in the standard state of partial pressure of monosilane in the reaction chamber 11 of the LPCVD apparatus 5 is recorded. In the present film forming sequence, for example, the average and standard deviation are calculated from the data of concentration measurement for 3 minutes before supply of monosilane gas, and the UCL (upper control limit=average+3×standard deviation) is returned to the main control section 13 from the analysis information/process parameter management database 3. It is determined that purge of monosilane gas is complete in the processing condition adjusting unit 13c when the latest continuous six measured values recorded in the measured value recording and calculating unit 13b, that is, all values measured in one minutes are less than the UCL, and gas purging by nitrogen gas is finished, and it is controlled to start supply of phosphine. Thus, the purge time is optimized and extra time is saved, thereby enhancing the production efficiency.

In mass analysis, the measuring time can be shortened by extracting and measuring the mass of only the intended $SiH_4$ and its fragment, and therefore analysis of once in 10 seconds can be shortened to once in 1 second, and the completion of purge can be determined in a shorter time. Similarly, in infrared absorption, the measuring speed of infrared absorption can be raised by measuring and analyzing only the absorption region by expansive vibration of Si—H bond.

(Step S111)

As mentioned above, end of nitrogen purge is determined automatically, and purging is finished in 3 minutes substantially.

(Step S112)

After completion of purging, in 13 minutes after start of film forming, phosphine gas is supplied as doping gas at a pressure of 266 Pa and flow rate of 200 sccm. The surface of the amorphous silicon film of 20 nm in thickness formed in advance is exposed to the phosphine gas atmosphere for 3 minutes, and a phosphorus adsorption layer is formed on the surface.

(Step S113)

Consequently, the phosphine gas atmosphere is, same as in the case of monosilane gas, replaced and purged with nitrogen sufficiently and in a shortest time by making use of feed-forward control by gas analysis.

(Step S114)

After purging, monosilane gas is supplied again in 20 minutes after start of film forming at chamber pressure of 133 Pa and flow rate of 100 sccm. By supply of monosilane gas, forming of the amorphous silicon film is started again.

(Step S115)

Since phosphorus is adsorbed on the initial amorphous silicon film. As a result, monosilane gas has reached the semiconductor substrate surface, regardless of this, film forming is not started for a while, for time $t_2$. The time $t_2$ is generally called deposition latent period. In this period, too, the pressure is controlled by the pressure control valve 15 so as to remain at 133 Pa. During this deposition latent period, the monosilane gas is not consumed by film forming, and decomposition reaction is not promoted. Therefore a large amount of monosilane gas is discharged to the exhaust device side.

Accordingly, in order to maintain the pressure in the reaction chamber 11 at 133 Pa, in spite of the same pressure, same monosilane gas flow rate, and same temperature as in time $t_1$, the throttle mechanism of the pressure control valve 15 opens wider to raise the conductance as compared with that in time $t_1$. After the deposition latent time, film forming starts, and monosilane gas induces decomposition reaction on the semiconductor substrate surface in the reaction chamber, and the monosilane is consumed and the exhaust amount decreases. Then, the pressure control valve returns to the same opening degree as in the first time $t_1$.

Time-course changes of the opening degree of the pressure control valve 15 are outputted to the main control section 13 at time intervals of once in every 1 msec. The measured value recording/calculation unit 13b statistically processes and calculates the measured values in real time by time differentiation, time average or variance, and the change of opening degree of the pressure control valve is statistically shown in real time.

(Step S116)

End of deposition latent phenomenon can be detected by comparing the values recorded in the analysis information/process parameter management database 3. For example, the average and standard deviation obtained statistically same as the opening degree of the throttle mechanism of the pressure control valve 15 forming the first layer in a thickness of 20 nm, UCL (=average+3×standard deviation), and LCL (=average−3×standard deviation), with the difference from the average values continuously calculated in the measured value recording/calculation unit 13b, and checking whether or not the change is significant as seen from the linear variance analysis, t-test or other variance analysis, or determining on the basis of UCL and LCL.

(Step S117)

For example, by accurately detecting the deposition latent time $t_2$=8 minutes, from the temperature and pressure at this time, the film forming time $t_3$=10 minutes necessary for obtaining a desired film thickness can be calculated from the film forming speed same as in the case of the first layer.

(Step S118)

From the initial film forming time of 11 minutes described in the film forming recipe, it is changed to 10 minutes in real time by feed-forward control.

(Step S119)

When reaching 10 minutes, supply of monosilane gas is stopped, and forming of the amorphous silicon film is terminated.

In step S104 or S105, if the temperature in the reaction chamber is changed to 551° C. from the set value of 550° C., the film forming speed at 551° C. is obtained from the analysis information/process parameter management database 3. However, there is no record of film forming speed at 551° C. in the analysis information/process parameter management database 3. When there are records at 540° C., 550° C., and 560° C. only, feed-forward control is executed by interpolating the film forming time derived from the linear function of the reciprocal number of absolute temperature of the film forming speed at 551° C. and the logarithm of the film forming speed.

When changed to 551° C., meanwhile, only the record of film forming speed at 550° C. in the LPCVD apparatus 5 is available in the analysis information/process parameter management database 3. Therefore, the film forming speed at 551° C. cannot be obtained by interpolation, the population of records is too small, and too much time has passed and the precision is not assured, and in order to compensate for defects, it is also possible to use film forming speed data of apparatus or other type or apparatus specified to be similar managed in the analysis information/process parameter management database 3. At this time, the precision can be further enhanced by using offset parameters for compensating for the difference between apparatuses or difference between types of apparatuses.

A block diagram in FIG. 5 shows a semiconductor device manufacturing system capable of changing the film forming conditions by using data of other apparatus.

Same as in the semiconductor device shown in FIG. 1, the CIM server 1 comprising a process information management database 2, an analysis information/process parameter management database 3, and a product information management database 4 is linked to a film forming apparatus group control device 26 for managing the film forming information and film forming recipe of plural film forming apparatuses through a local area network 25a in the plant, and is connected to a film forming apparatus 27 (27a, 27b, 27c) which is the semiconductor manufacturing apparatus managed by the film forming apparatus group control device 26.

The local area network 25a is also connected to a measuring apparatus group control device 30 which controls a first film thickness control device 31a and a second film thickness control device 31b, and manages the measured data.

Each film forming apparatus 27 comprises an apparatus controller 28 (28a, 28b, 28c) as the apparatus control section, and is also provided with a gas analysis measuring instrument 29 (29a, 29b, 29c).

In the film forming process by the film forming apparatus 27a, changes of temperature and pressure and results of gas analysis are transmitted and recorded in the film forming apparatus group control device 26 through the apparatus controller 28, and also recorded in the analysis information/process parameter management database 3. The result of film forming, for example, the thickness is measured in the film thinness measuring instrument 31a at the end of the process, and is recorded in the analysis information/process parameter management database 3 through the film forming measuring instrument group control device 30. The data is also recorded in the film forming apparatus group control device 26 through the local area network 25a in the plant. In the film forming apparatus group control device 26, the film forming apparatus 27b of a same type, and the film forming process of the same type conducted in the past in the film forming apparatus 27b, and the film thickness measured by the film thickness measuring apparatus 31a or 31b at this time are recorded. When they are compared, not only the correlation is obtained about the changes of temperature and pressures, results of gas analysis and film thickness in the film forming apparatus 27a, but also results of the film forming apparatus 27b and the film forming apparatus 27c can be compared, thereby supplementing with a small quantity of data. Further by knowing the difference between the film forming apparatuses or between measuring instruments statistically, the difference of the control sections of the apparatuses or the difference of the measuring instruments can be calculated, and offset parameters can be introduced, so that the real-time process control precision of using data from different apparatuses can be enhanced.

Not limited to the data in the film forming apparatus group control device 26, but also the data accumulated in the film forming apparatus installed in other plant can be similarly utilized by directly referring to the data of the group controller of the same type for controlling the film forming apparatus of the same type connected in the local area network 25b installed in another plant linked with the local area network 25a in the plant through the Internet, or by comparing the analysis information/process parameter management database 3 centrally managed by the CIM server 1 in the plant connected to the local area network 25a and a similar database of a similar server connected to the local area network 25b.

SECOND EMBODIMENT

A second embodiment, similarly to the first embodiment, relates to an example of forming low pressure chemical vapor deposition (LPCVD) films on a plurality of semiconductor substrates in a system comprising LPCVD apparatus and CIM server for controlling and managing it in a semiconductor manufacturing plant shown in FIG. 1.

A plurality of (up to 25) semiconductor substrates can be installed in a reaction chamber 11 composing the inside of the LPCVD apparatus 5. When forming films simultaneously on the surface of all of the installed semiconductor substrates, first, from the process information management database 2, the product to be processed in the film forming process by the LPCVD apparatus 5 is determined, and the film type, film thickness, and film forming condition are determined from the type of the process, and the film forming recipe information containing the temperature, pressure, and material gas flow rate determined in the film forming condition is automatically transmitted to the main control section 13 in the LPCVD apparatus 5 through the network. At this time, the number of semiconductor substrates to be installed in the reaction chamber 11 is also determined.

By the number of pieces instructed by the process information management database 2, the semiconductor substrates are supplied into the reaction chamber 11 by the automatic transfer machine, and according to the film forming recipe information transmitted from the process information management database 2, the real-time controller 13a commands the gas flow rate, increase or decrease speed of the gas flow rate, and the set value of opening or closing of the feed valve to the gas feed control section 7 at every stage of film forming recipe, and also commands the setting of temperature and the set value of pressure sequentially to the reaction chamber control section 10. The reaction chamber control section 10 controls the temperature by the heating section 12, and controls the pressure by the pressure gauge 18 and the pressure control valve 15.

In this LPCVD apparatus 5, assuming five semiconductor substrates are installed, silane gas is fed into the reaction chamber at a flow rate of 100 sccm at 550° C. and 133 Pa, and an amorphous silicon film is formed in a thickness of 20 nm in 11 minutes by LPCVD by pyrolysis, and execution of this recipe is explained in detail below.

When the film forming process is started, the real-time controller 13a commands the gas feed control section 7 to open the feed valve, and monosilane gas flows into the reaction chamber 11 at a flow rate of 100 sccm. Set values of temperature and pressure in the reaction chamber 11 are similarly command to the reaction chamber control section 10 from the real-time controller 13a. The reaction chamber control section 10 controls the heating section 12 to set the temperature in the reaction chamber 11 at 550° C. The reaction chamber control section 10 controls the pressure control valve 15 so that the value measured by the pressure gauge 18 is 133 Pa. The opening degree of the pressure control valve 15, mass analysis of gas in the reaction chamber by the gas mass analyzer 14, and infrared absorption analysis of gas in the reaction chamber by the infrared absorption analyzer 19 are measured at time intervals of once in every second, and results of measurement are outputted to the main control section 13.

The supplied monosilane gas is pyrolyzed on the inner wall surface of the reaction chamber 11 and on the surface of five semiconductor substrates installed in the reaction chamber, and an amorphous silicon film is deposited on each surface. The monosilane gas is consumed in the following reaction, and hydrogen gas is generated instead.

$$SiH_4 \rightarrow SiH_2 + H_2 \rightarrow Si + 2H_2$$

Chemical reaction of monosilane gas mainly takes place on the surface of semiconductor substrate only, and the consumption of monosilane gas varies with the number of semiconductor substrates installed in the reaction chamber. Depending on the consumption of the monosilane gas, the opening degree of the pressure control valve 15, partial pressure of monosilane exhausted from the reaction chamber, and concentration of hydrogen are different.

The analysis information/process parameter management database 3 has recorded therein the film forming speed in the same condition when 25 semiconductor substrates are installed in the LPCVD apparatus 5, the opening degree of the pressure control valve at this time, and monosilane partial pressure and hydrogen partial pressure in the exhaust gas. The analysis information/process parameter management database 3 also has stored therein formulas for calculating the consumption of monosilane per semiconductor substrate from the opening degree of adjusting valve, and monosilane gas partial pressure and hydrogen partial pressure in the exhaust gas, in each LPCVD apparatus, each temperature condition, and each pressure condition.

By the instruction from the CIM server 1, the relation formula of the monosilane consumption at the reaction chamber temperature of 550° C. and reaction chamber pressure of 133 Pa is outputted to the main control section 13 from the analysis information/process parameter management database 3. The measured value recording/calculation unit 13b calculates the consumption speed of monosilane gas per semiconductor substrate by using the measured opening degree of adjusting valve, monosilane gas partial pressure and hydrogen partial pressure in exhaust gas, and the relation formulas. The calculated consumption speed is compared with the monosilane consumption speed recorded in the analysis information/process parameter management database 3, and if larger, the processing condition adjusting unit 13c controls to decrease the silane gas supply from 100 sccm to, for example, 60 sccm by real-time feed-forward control, so that the consumption speed may be equal to the consumption speed per piece of 25 installed semiconductor substrates. Thus, the consumption speed per piece is kept constant regardless of the number of semiconductor substrates being installed, and therefore the film forming speed on each substrate is always the same even when the number of substrates increases or decreases.

Further, with the monosilane gas flow rate unchanged, the increment of film forming speed can be calculated from the relation formula of the monosilane gas consumption speed and film forming speed recorded in the analysis information/process parameter management database 3, and by real-time feed-forward control so as to adjust the initial film forming time of 11 minutes to 8 minutes, for example, a desired film thickness may be obtained, and thus precise film forming control is realized.

After film forming, in the next inspection process, the film thickness on the semiconductor substrate is measured, and the inspection results are outputted to the analysis information/process parameter management database 3 storing the processing capability and analysis and measurement information by way of the production information management database 4, and stored as the correlation data of the film forming speed and the opening degree of the pressure control valve 15, and output values of mass analysis and infrared absorption analysis, so that the database may be always updated for use in subsequent film forming control.

Instead of semiconductor substrates of flat surface registered in the database, when plural semiconductor substrates forming grooves on the surface and hence different in the surface area per piece are installed in the reaction chamber 11, the film forming method by LPCVD is explained below. In this example, 25 semiconductor substrates of surface area is three times wider are installed in the reaction chamber 11, and silane gas is supplied into the reaction chamber at a flow rate of 100 sccm at temperature of 55° C. and pressure of 133 Pa, and an amorphous silicon film is formed in a thickness of 20 nm in 10 minutes by LPCVD by pyrolysis.

The product information management database 4 informs the analysis information/process parameter management database 3 that the surface area of the semiconductor substrate is three times wider in design. When monosilane gas is supplied, since the surface area of the semiconductor substrate is three times, the consumption is increased as compared with the consumption speed of monosilane in the reference state recorded in the analysis information/process parameter management database 3, and the opening degree of the pressure control valve 15 becomes smaller, and the silane partial pressure in the exhaust gas drops while the hydrogen concentration elevates. By comparing the consumption speed of monosilane gas per unit area with the state of amounting of 25 flat semiconductor substrates recorded in the analysis information/process parameter management database 3, the processing condition adjusting unit 13c calculates a monosilane supply rate necessary for equalizing the consumption speed per unit area, and commands the gas feed control section 7 by feedback control.

For example, by increasing from 100 sccm to 250 sccm, shortage of monosilane gas can be avoided, and sufficient monosilane is supplied on the entire surface of 25 semiconductor substrates, and the film forming speed can be maintained.

Incidentally, if the correlation data of mass analysis or infrared absorption analysis, and opening degree of pressure control valve and consumption of monosilane is not available in a sufficient number of samples in the analysis information/process parameter management database 3, for example, the gas flow rate is changed from 100 sccm to 110 sccm in differential function or delta function, or the temperature in the reaction chamber is changed from 550° C. to 555° C. Then, the change amount of silane gas partial pressure or change amount of hydrogen gas concentration is measured, and the consumption of the monosilane may be determined depending on the obtained change amount, that is, whether the silicon film forming is reaction rate-determining or supply rate-determining.

THIRD EMBODIMENT

A third embodiment, similarly to the first embodiment, relates to an example of tube cleaning by chlorine trifluoride ($ClF_3$) gas in a system comprising an LPCVD apparatus and a CIM server for controlling and managing the LPCVD apparatus in a semiconductor manufacturing plant shown in FIG. 1.

Tube cleaning is intended to clean a silicon film or silicon nitride film deposited in film forming process. By feeding $ClF_3$ gas into the inner wall and piping of the reaction chamber 11 for composing the inside of the LPCVD apparatus 5, the reaction chamber is heated to clean the silicon film and silicon nitride film in the reaction chamber 11 by decomposition reaction by thermal reaction.

At the time of tube cleaning, in the process information management database 2, from the process history after the previous tube cleaning in the LPCVD apparatus 5, the film type, film thickness, and film forming condition of the CVD film deposited in the reaction chamber 11 are determined. Depending on the determining result, the cleaning condition is determined, and the $ClF_3$ cleaning recipe information including the temperature, pressure and material gas flow rate determined in the condition is automatically transmitted to the main control section 13 in the LPCVD manufacturing apparatus 5 through the network.

According to the transmitted cleaning recipe information, the real-time controller 13a commands the gas flow rate, increase or decrease speed of gas flow rate, and opening or closing of feed valve to the gas feed control section 7 so as to be adjusted to each set value at every stage of cleaning recipe, and also commands setting of temperature and setting of pressure sequentially to the reaction chamber control section 10. The reaction chamber control section 10 controls the temperature by the heating section 12, and controls the pressure by the pressure gauge 18 and pressure control valve 15.

Assuming, in the LPCVD apparatus 5, to feed $ClF_3$ into the reaction chamber 11 at a flow rate of 1000 sccm, at 400° C. and 133 Pa, in this example, the silicon nitrogen film of 200 nm in thickness deposited in the reaction chamber 11 is completely removed by etching for 5 minutes by pyrolysis.

The real-time controller 13a, when film forming process starts, commands the gas feed control section 7, and the feed valve is opened, and $ClF_3$ gas is fed into the reaction chamber 11 at a flow rate of 1000 sccm. Temperature and pressure in the reaction chamber are also commanded to the reaction chamber control section 10 by the real-time controller 13a. The reaction chamber control section 10 controls the temperature to 400° C. by the heating section 12, and reads the pressure from the pressure gauge 18 and controls to 133 Pa by the pressure control valve 15. At the same time, the opening degree of pressure control valve 15, gas mass analysis result of the reaction chamber gas by the gas mass analyzer 14, and infrared absorption analysis result of gas in the reaction chamber 11 by the infrared absorption analyzer 19 are outputted to the main control section 13 at time intervals of once in every second.

The supplied ClF$_3$ gas is pyrolyzed n the inner wall surface of the reaction chamber 11, and is consumed in the following chemical reaction, and silicon fluoride and nitrogen fluoride are produced instead.

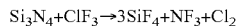

When the silicon nitride film deposited in the reaction chamber is completely removed by etching, the quartz in the wall of the reaction chamber 11 is etched, but the thermal reaction is lower than in the silicon nitride film, and the consumption speed of ClF$_3$ gas is slow. It hence causes changes in the opening degree of the pressure control valve 15, or partial pressure of the silicon fluoride or nitrogen compound discharged from the reaction chamber.

The analysis information/process parameter management database 3 keeps records of opening degree of pressure control valve, partial pressure of ClF$_3$ in exhaust gas, and partial pressure of byproducts such as silicon fluoride and nitrogen fluoride, in the same condition as in etching of silicon nitride film or etching of quartz inner wall after finishing etching of silicon nitride film, in the LPCVD apparatus 5. The processing condition adjusting unit 13c compares the degree of pressure control valve and recorded value of partial pressure, with the measured values inputted in the measured value recording/calculation unit 13b from the pressure control valve 15 or gas mass analyzer 14, and determines the etching termination time in the reaction chamber 11. By finishing etching from the determining result, the etching time is optimized and shortened, and therefore the consumption of ClF$_3$ gas is kept to a minimum and damage of quartz wall for composing the inner wall of the reaction chamber 11 may be kept to a minimum limit.

In the mass analysis, by extracting and measuring only the intended SiF$_4$, ClF$_3$ and its fragment mass, the measuring time can be shortened, and therefore the analysis of once in every 1 second can be shortened to ten times per second., and completion of etching can be determined in a shorter time. Similarly, in infrared absorption analysis, by measuring and analyzing only the absorption region due to expansive vibration of Si—F bond necessary for analysis of SiF$_4$, the speed of measurement of infrared absorption can be raised.

The invention is not limited to the illustrated embodiments alone, but may be changed and modified in various manners within a scope not departing from the true spirit of the invention in the stage of carrying out. The embodiments include various stages of the invention, and various inventions may be extracted by proper combinations of the disclosed requirements. For example, if several constituent requirements are deleted from all constituent requirements disclosed in the embodiments, problems to be solved by the invention can be also solved, and effects as mentioned herein can be obtained, and in these cases such constitutions omitting some of the constituent requirements are also realized as different forms of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:

determining a first processing condition to apply a predetermined processing to a base body in a reaction chamber of a semiconductor device manufacturing apparatus on the basis of processing information including a processing condition, the base body being submitted to a process of the semiconductor device;

processing the base body according to the determined first processing condition;

measuring one or more process parameters which vary a processing capability of the process on the base body during the processing;

determining a second processing condition during the processing so that a processing amount may be a set value, from a processing capability information, the measured process parameters, analysis measured values of the measured process parameters, and a reference state representing a relation between the processing capability information and the analysis measured values; and changing the processing condition from the first processing condition to the second processing condition during the processing and performing the processing based on the second processing condition, in a case where the second processing condition is different from the first processing condition.

2. The method for manufacturing a semiconductor device according to claim 1, wherein the processing is performed simultaneously on plural base bodies stored in the reaction chamber, and the second processing condition is determined so that the processing amount applied to each base body is a set value.

3. The method for manufacturing a semiconductor device according to claim 1, wherein the processing amount applied to the base body is measured after the processing, and a new reference state representing the relation between the processing capability information determined from the measured processing amount and the analysis measured values is created.

4. The method for manufacturing a semiconductor device according to claim 1, wherein the reference state is prepared in every semiconductor device manufacturing apparatus, and the second processing condition is determined by referring also to the reference state prepared in another semiconductor device manufacturing apparatus, among plural semiconductor device manufacturing apparatuses designed for similar processing.

5. The method for manufacturing a semiconductor device according to claim 1, wherein the reference state is prepared in every semiconductor device manufacturing apparatus, and when the reference state corresponding to the processing capability is not prepared in the semiconductor device manufacturing apparatus which performs the processing of the base body, the second processing condition is determined from the process parameters and the reference state prepared in another semiconductor device manufacturing apparatus designed for similar processing.

6. The method for manufacturing a semiconductor device according to claim 1, wherein the second processing condition is determined from data obtained by compensating the reference state which does not correspond to the second processing condition when there is no reference condition corresponding to the second processing condition.

7. The method for manufacturing a semiconductor device according to claim 1,
wherein the base body is a semiconductor device in the midst of manufacturing process, and the reference state is classified according to the processing condition, and at least one of design information and inspection information of the semiconductor device.

8. The method for manufacturing a semiconductor device according to claim 7,
wherein the second processing condition is determined from data obtained by compensating the reference state which does not correspond when there is no reference condition corresponding to the processing condition, and the design condition or inspection information.

9. The method for manufacturing a semiconductor device according to claim 1,
wherein the process parameter in the reference state is converted into a statistic numerical value.

10. The method according to claim 1, wherein the base body constitutes a workpiece.

11. The method according to claim 10, wherein the workpiece is a semiconductor substrate.

12. A method for manufacturing a semiconductor device, comprising:
determining a first processing condition to apply a predetermined processing to a base body in a reaction chamber on the basis of a processing information including a processing condition, the base body being submitted to a process of the semiconductor device;
processing the base body according to the determined first processing condition;
measuring at least one of process parameters which vary the processing capability of the process on the base body during the processing;
determining a second processing condition different from the first processing condition based on at least the measured process parameters during the processing; and
changing the processing condition from the first processing condition to the second processing condition during the processing and performing the processing based on the second processing condition.

* * * * *